US011908791B2

(12) United States Patent
Mukesh et al.

(10) Patent No.: US 11,908,791 B2
(45) Date of Patent: Feb. 20, 2024

(54) PARTIAL SUBTRACTIVE SUPERVIA ENABLING HYPER-SCALING

(71) Applicant: INTERNATIONAL BUSINESS MACHINES CORPORATION, Armonk, NY (US)

(72) Inventors: Sagarika Mukesh, Albany, NY (US); Nicholas Anthony Lanzillo, Wynantskill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 171 days.

(21) Appl. No.: 17/532,310

(22) Filed: Nov. 22, 2021

(65) Prior Publication Data

US 2023/0163064 A1    May 25, 2023

(51) Int. Cl.
*H01L 23/522* (2006.01)
*H01L 21/768* (2006.01)

(52) U.S. Cl.
CPC .... *H01L 23/5226* (2013.01); *H01L 21/76804* (2013.01)

(58) Field of Classification Search
CPC .................. H01L 23/5226; H01L 21/76804
USPC ......................................................... 257/774
See application file for complete search history.

(56) References Cited

U.S. PATENT DOCUMENTS

| 8,357,609 | B2 | 1/2013 | Ryan |
| 9,502,350 | B1 | 11/2016 | Bonilla et al. |
| 9,601,426 | B1 | 3/2017 | Bonilla et al. |
| 9,786,597 | B2 | 10/2017 | Chang et al. |
| 9,887,133 | B2 | 2/2018 | Chi et al. |
| 10,020,254 | B1 | 7/2018 | Bao et al. |
| 10,026,687 | B1 | 7/2018 | Lin et al. |
| 10,177,031 | B2 | 1/2019 | Bao et al. |
| 10,283,407 | B2 | 5/2019 | Chi et al. |
| 10,546,772 | B2 | 1/2020 | Chandhok et al. |
| 2022/0375785 | A1* | 11/2022 | Seo .................. H01L 21/76829 |

* cited by examiner

*Primary Examiner* — Tu-Tu V Ho
(74) *Attorney, Agent, or Firm* — Tutunjian & Bitetto, P.C.; L. Jeffrey Kelly

(57) ABSTRACT

A semiconductor device includes an upper section of a supervia formed via subtractive etching and a lower section of the supervia formed via damascene processing. The supervia connects non-adjacent interconnect wiring. The lower section and the upper section of the supervia each define a generally cone-shaped configuration. A distal end of the lower section of the supervia is non-obtuse. Moreover, the lower section of the supervia is formed in a V0 level and the upper section of the supervia is formed in a M1/V1 metallization level.

17 Claims, 5 Drawing Sheets

PARTIAL SUBTRACTIVE SUPERVIA ENABLING HYPER-SCALING

BACKGROUND

The present invention relates generally to semiconductor devices, and more specifically, to a partial subtractive supervia enabling hyper-scaling.

Generally, an interconnect structure incorporated into an integrated circuit (IC) includes one or more levels of metal lines to connect the electronic devices of the IC to one another and to external connections. An interlayer dielectric (ILD) is placed between the metal levels of the IC for insulation. Usually a damascene process, is used to fabricate a copper interconnect. In this process, the underlying silicon oxide insulating layer is patterned to form trenches. The trenches in the insulating layer are filled with a thick layer of copper, and chemical-mechanical polishing (CMP) is used to remove the copper that extends above the top of the insulating layer. Copper within the trenches of the insulating layer is not removed and becomes the patterned conductor. Moreover, in a dual damascene (DD) process, two features of copper interconnect are formed at once, that is, a trench overlying a via, may both be filled with a single copper deposition. In most cases, the DD interconnects need a liner for adhesion and a hermetic barrier to protect the metal. The liner in the DD interconnects is usually non-conducting and adds to the line resistance.

SUMMARY

In accordance with an embodiment, a semiconductor device is provided. The semiconductor device includes an upper section of a supervia formed via subtractive etching and a lower section of the supervia formed via damascene processing, where the supervia connects non-adjacent interconnect wiring.

In accordance with another embodiment, a semiconductor device is provided. The semiconductor device includes an upper section of a supervia formed via subtractive etching and a lower section of the supervia formed via damascene processing, where a maximum width of the upper section of the supervia is greater than a maximum width of the lower section of the supervia.

In accordance with yet another embodiment, a method is provided for forming a semiconductor device. The method includes forming an upper section of a supervia via subtractive etching, forming a lower section of the supervia via damascene processing, and enabling the supervia to connect non-adjacent interconnect wiring.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
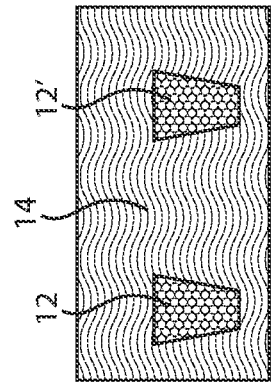
FIG. 1 is a cross-sectional view of a semiconductor structure where conductive lines are formed within a substrate, in accordance with an embodiment of the present invention.

Embodiments in accordance with the present invention provide methods and devices for a vertical interconnect connection between non-adjacent interconnect wiring such that a lower portion of a supervia has a damascene profile while an upper portion of the supervia has a subtractive profile. The damascene lower portion of the via is formed using standard damascene processing techniques. Then higher metal levels, including both lines and vias, are formed above with substrative techniques. A block mask is used to remove dielectric and metal material in a supervia region. This is followed by metal deposition and etching, which forms the upper segment of the supervia. The supervia is a hyper-scaling element that enables sub 24p technology.

As the size of the integrated circuit (IC) decreases, the spacing between the metal lines decreases. This leads to an increase in the coupling capacitance between the metal lines. An increase in the coupling capacitance between the metal lines has a negative impact on signal transmission along metal lines. Furthermore, an increase in the coupling capacitance increases energy consumption of the integrated circuit. Another patterning technique to form an interconnect is a subtractive patterning technique. However, subtractive interconnects are not self-aligned to the via below. Generally, subtractive patterning of the metal lines is performed independently of the vias below, so that the location of the via below the metal layer cannot be accurately determined, thus causing an increase in via resistance and leading to potential shorting to the wrong metal line.

Generally, for a subtractive patterning technique, fabrication of an integrated circuit involves etching an interconnect layer (e.g., a metal, or other interconnect layer) using a mask. The subtractively patterned interconnects provide lower line resistance and capacitance benefits over conventional dual damascene interconnects. Subtractive interconnects can also have patterned mono-lithic vias self-aligned to the metal above to enable mask less airgaps to reduce capacitance.

Embodiments in accordance with the present invention provide a method and structure for a vertical interconnect connection between non-adjacent interconnect wiring such that the lower portion of the supervia has a damascene profile while the upper portion of the supervia has a subtractive profile. The supervia is formed by using both subtractive metal etch and damascene etching techniques with metal fill. The supervia can thus connect non-adjacent interconnect wiring.

Examples of semiconductor materials that can be used in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure where conductive lines are formed within a substrate, in accordance with an embodiment of the present invention.

A semiconductor structure 5 includes a semiconductor substrate 10. Conductive lines 12, 12' are formed within the substrate 10.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

In other embodiments, the substrate 10 can be an interlayer dielectric (ILD), which can be any suitable dielectric such as, for example, silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN), hydrogenated oxidized silicon carbon (SiCOH), or any suitable combination of those materials.

The conductive lines 12, 12' can be, e.g., formed from Ta, Ti/TiN, W, WN, TaN, polysilicon, doped polysilicon, amorphous silicon, doped amorphous silicon, or any other suitable material, or any other conductive material. Alternatively, the conductive lines 12, 12' can be, e.g., any suitable conductive material or materials, e.g., Ag, Al, Cu, TaN, Ti, TiN, Al or any other suitable material, and can be deposited or formed in any suitable manner.

In another embodiment, the conductive lines 12, 12' are e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof.

The conductive lines 12, 12' are deposited using one of deposition techniques, such as but not limited to a CVD, PVD, MBE, MOCVD, ALD, spin-on, electro-less, electroplating, or other deposition techniques known to one of ordinary skill in the art of microelectronic device manufacturing.

Figure 2:
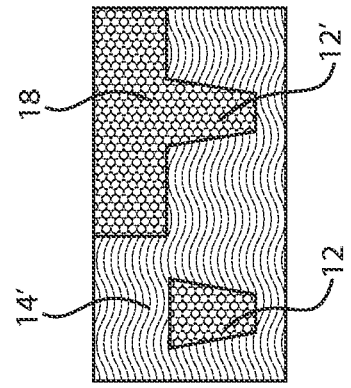
FIG. 2 is a cross-sectional view of the semiconductor structure of FIG. 1 where a first dielectric is deposited over the conductive lines, in accordance with an embodiment of the present invention.

FIG. 2 is a cross-sectional view of the semiconductor structure of FIG. 1 where a first dielectric is deposited over the conductive lines, in accordance with an embodiment of the present invention.

In various example embodiments, a first dielectric layer 14 is deposited over the conductive lines 12, 12'.

The first dielectric layer 14 can include, but is not limited to, SiN, SiOCN, SiOC, SiBCN, $SO_2$, or ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 10.

In one embodiment, the first dielectric layer 14 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride, or any combination thereof. In one embodiment, the first dielectric layer 14 includes a dielectric material having k-value less than 5. In one embodiment, the first dielectric layer 14 includes a dielectric material having k-value less than 2. In alternative embodiments, the first dielectric layer 14 includes a nitride, oxide, a polymer, phosphosilicate glass, fluorosilicate (SiOF) glass, organosilicate glass (SiOCH), other electrically insulating layer determined by an electronic device design, or any combination thereof.

In some embodiments, the first dielectric layer 14 can be conformally deposited using ALD or CVD. Variations of CVD processes suitable for forming the first dielectric layer 14 include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

Figure 3:
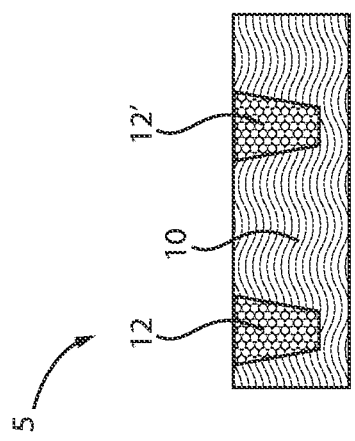
FIG. 3 is a cross-sectional view of the semiconductor structure of FIG. 2 where the first dielectric is etched to expose at least one of the conductive lines, in accordance with an embodiment of the present invention.

FIG. 3 is a cross-sectional view of the semiconductor structure of FIG. 2 where the first dielectric is etched to expose at least one of the conductive lines, in accordance with an embodiment of the present invention.

In various example embodiments, a mask 15 is deposited and the first dielectric layer 14 is etched to expose at least one of the conductive lines 12'. The etching results in remaining first dielectric layer 14'. The etch can extend a distance $D_1$ to create the opening 16 over the conductive line 12' to expose the top surface 11'.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

Figure 4:
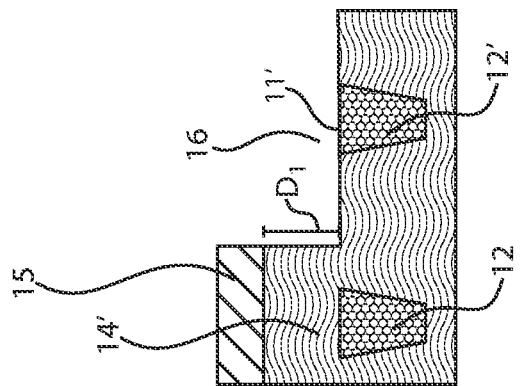
FIG. 4 is a cross-sectional view of the semiconductor structure of FIG. 3 where a first metal fill takes place over the exposed conductive lines, in accordance with an embodiment of the present invention.

FIG. 4 is a cross-sectional view of the semiconductor structure of FIG. 3 where a first metal fill takes place over the exposed conductive lines, in accordance with an embodiment of the present invention.

In various example embodiments, a first metal fill 18 takes place over the exposed conductive line 12'.

In various exemplary embodiments, the height of the first metal fill 18 can be reduced by CMP and/or etching. Therefore, the planarization process can be provided by CMP. Other planarization process can include grinding and polishing.

Non-limiting examples of suitable conductive materials for the metal fill include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition. The conductive material can be deposited by a suitable deposition process, for example, CVD, PECVD, PVD, plating, thermal or e-beam evaporation, and sputtering.

Figure 5:
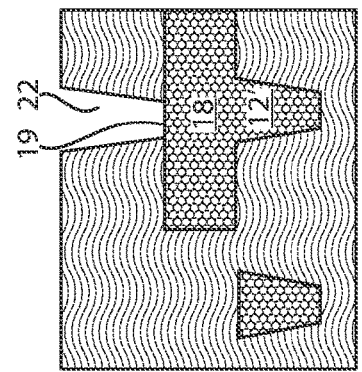
FIG. 5 is a cross-sectional view of the semiconductor structure of FIG. 4 where a second dielectric is deposited, in accordance with an embodiment of the present invention.

FIG. 5 is a cross-sectional view of the semiconductor structure of FIG. 4 where a second dielectric is deposited, in accordance with an embodiment of the present invention.

In various example embodiments, a second dielectric layer 20 is deposited. The second dielectric layer 20 can be the same material as described above with respect to the first dielectric layer 14.

Figure 6:
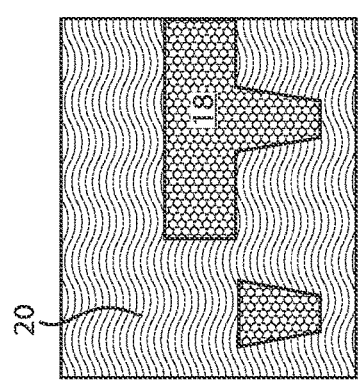
FIG. 6 is a cross-sectional view of the semiconductor structure of FIG. 5 where an etch is performed to the top surface of the first metal fill, in accordance with an embodiment of the present invention.

FIG. 6 is a cross-sectional view of the semiconductor structure of FIG. 5 where an etch is performed to the top surface of the first metal fill, in accordance with an embodiment of the present invention.

In various example embodiments, an etch is performed to the top surface 19 of the first metal fill 18. The etch creates an opening 22.

Figure 7:
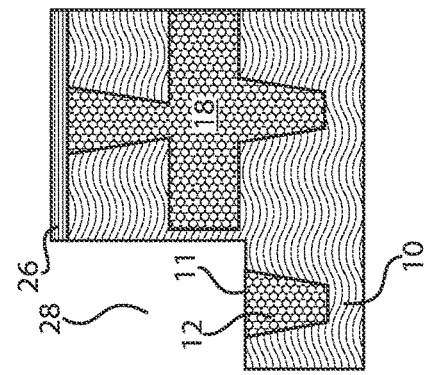
FIG. 7 is a cross-sectional view of the semiconductor structure of FIG. 6 where a second metal fill takes place, in accordance with an embodiment of the present invention.

FIG. 7 is a cross-sectional view of the semiconductor structure of FIG. 6 where a second metal fill takes place, in accordance with an embodiment of the present invention.

In various example embodiments, the opening 22 is filled with a second metal fill 24. The second metal fill 24 can be the same material as described above with respect to the first metal fill 18.

Figure 8:
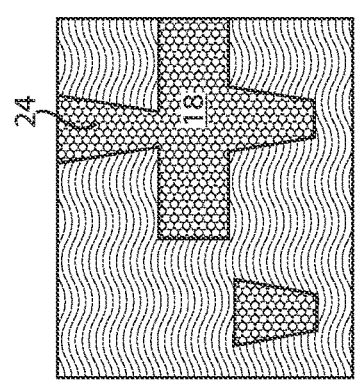
FIG. 8 is a cross-sectional view of the semiconductor structure of FIG. 7 where a block mask is deposited and a dielectric etch takes place to expose a conductive line within the substrate, in accordance with an embodiment of the present invention.

FIG. 8 is a cross-sectional view of the semiconductor structure of FIG. 7 where a block mask is deposited and a dielectric etch takes place to expose a conductive line within the substrate, in accordance with an embodiment of the present invention.

In various example embodiments, a block mask 26 is deposited and a dielectric etch takes place to expose a conductive line 12 within the substrate 10. The opening 28 results in the exposure of the top surface 11 of the conductive line 12.

It is noted that FIGS. 1-8 are intended to show regular patterning for the usual metal levels with an addition of the bottom of the super via sitting next to these regular features. The innovative structure is the supervia itself formed in FIG. 10.

In one embodiment, the block mask 26 is a nitride layer, e.g., a silicon nitride, a silicon oxide nitride, silicon oxide, amorphous silicon, polysilicon, a carbon layer, e.g., amorphous carbon, silicon carbide, germanium, other hard mask layer, or any combination thereof. The block mask 26 can be deposited using one of the hard mask layer deposition techniques known to one of ordinary skill in the art of electronic device manufacturing.

Generally, the material choices for the block mask 26 is such that the hard mask does not etch away during the trench etch in the underlying one or more layers (e.g., conductive lines 12, 12', first dielectric layer 14, second dielectric layer 20, etc.) later in a process. In another embodiment, the block mask 26 is one or more of oxides, nitrides, oxynitrides, metallic oxides, carbides, oxycarbides, metallic nitrides, metallic carbides, or any combination thereof.

Figure 9:
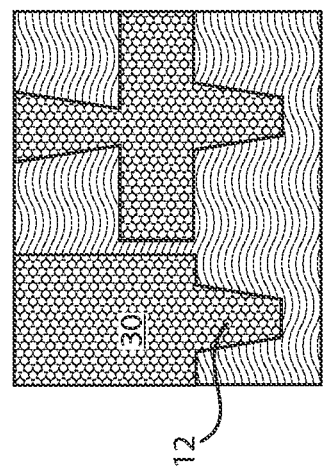
FIG. 9 is a cross-sectional view of the semiconductor structure of FIG. 8 where a conductive material is formed over the exposed conductive lines, in accordance with an embodiment of the present invention.

FIG. 9 is a cross-sectional view of the semiconductor structure of FIG. 8 where a conductive material is formed over the exposed conductive lines, in accordance with an embodiment of the present invention.

In various example embodiments, a conductive material 30 is formed over the exposed conductive line 12.

Figure 10:
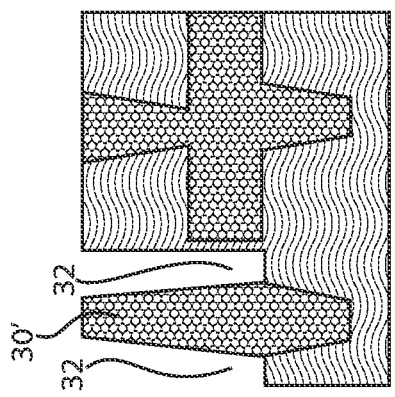
FIG. 10 is a cross-sectional view of the semiconductor structure of FIG. 9 where the conductive material is etched to form openings adjacent a cone-shaped conductive section, in accordance with an embodiment of the present invention.

FIG. 10 is a cross-sectional view of the semiconductor structure of FIG. 9 where the conductive material is etched to form openings adjacent a cone-shaped conductive section, in accordance with an embodiment of the present invention.

In various example embodiments, the conductive material 30 is etched to form openings 32 adjacent a cone-shaped conductive section 30'. The cone-shaped conductive section 30' will define the upper section or portion of the supervia.

Figure 11:
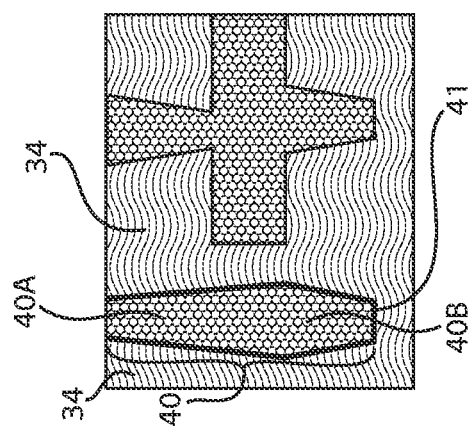
FIG. 11 is a cross-sectional view of the semiconductor structure of FIG. 10 where the openings are filled with a third dielectric to form a supervia, in accordance with an embodiment of the present invention.

FIG. 11 is a cross-sectional view of the semiconductor structure of FIG. 10 where the openings are filled with a third dielectric to form a supervia, in accordance with an embodiment of the present invention.

In various example embodiments, the openings 32 are filled with a third dielectric 34 to form a supervia 40. The supervia 40 has a substantially bowling pin shape. The supervia 40 thus has a top section 40A (or upper section) and a bottom section 40B (or lower section). The top section 40A is substantially or generally cone-shaped and the bottom section 40B is substantially or generally cone-shaped. The maximum width of the top section 40A is equal to the maximum width of the bottom section 40B. Thus, the distal end 41 of the bottom section 40B is flat, not sharp or pointy. Stated differently, the distal end 41 is not obtuse (non-obtuse) or acute or angled or slanted or inclined. Instead, the distal end 41 defines a relatively large bottom critical dimension (CD).

This embodiment is compatible with a damascene line and via formation. This embodiment also overcomes the issue of small bottom critical dimension (CD), thereby enabling a >50% reduction in supervia resistance.

Therefore, the exemplary embodiments disclose a damascene lower portion of the via that is formed using standard damascene processing techniques. Then higher metal levels, including both lines and vias, are formed above with substrative etching techniques. A block mask 26 is used to remove dielectric and metal material in the supervia region. This is followed by metal deposition and etching, which forms the top section 40A of the supervia 40. The exemplary embodiments thus enable a via that skips a metal level ("skip-via", or "super-via") and connects two non-adjacent metal levels. This further enables a low-resistance connection that wouldn't otherwise exist, and also avoids minimum-area constraints that restrict density scaling.

Figure 12:
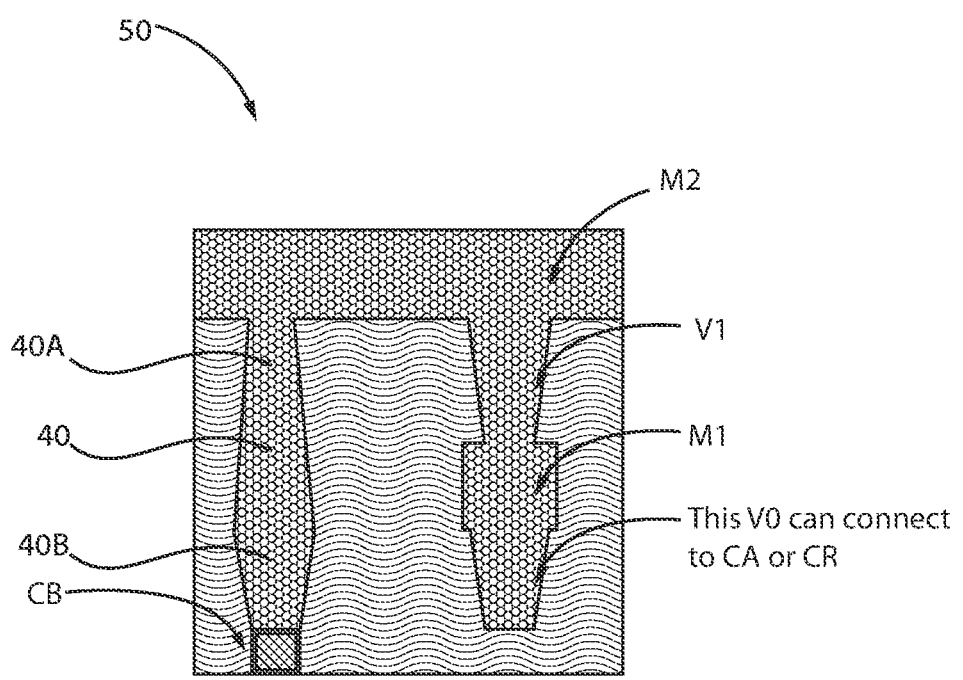
FIG. 12 is a cross-sectional view of a semiconductor structure where the supervia is formed over a gate contact (CB), in accordance with an embodiment of the present invention.

FIG. 12 is a cross-sectional view of a semiconductor structure 50 where the supervia is formed over a gate contact (CB), in accordance with an embodiment of the present invention.

In various example embodiments, a top section 40A of the supervia 40 is formed in the M1 metallization level and the bottom section 40B of the supervia 40 is formed in the V0 level. The supervia 40 is formed by using both subtractive metal etch and damascene etching techniques with metal fill. The supervia 40 can thus connect non-adjacent interconnect wiring. The bottom section 40B is formed by using damascene processing, whereas the top section 40A is formed by using subtractive processing.

Figure 13:
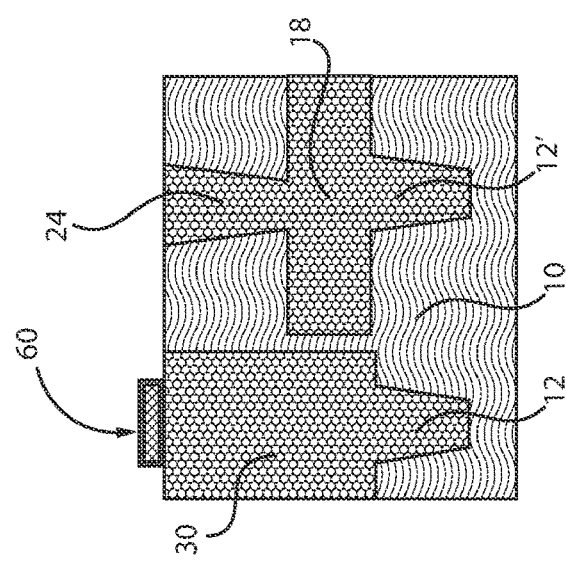
FIG. 13 is a cross-sectional view of a semiconductor structure where a supervia mask is deposited over the conductive material of FIG. 9, in accordance with an embodiment of the present invention.

FIG. 13 is a cross-sectional view of a semiconductor structure where a supervia mask is deposited over the conductive material of FIG. 9, in accordance with an embodiment of the present invention.

In various example embodiments, a supervia mask 60 is deposited over the conductive material 30 of FIG. 9. The conductive material is formed over the conductive line 12.

Figure 14:
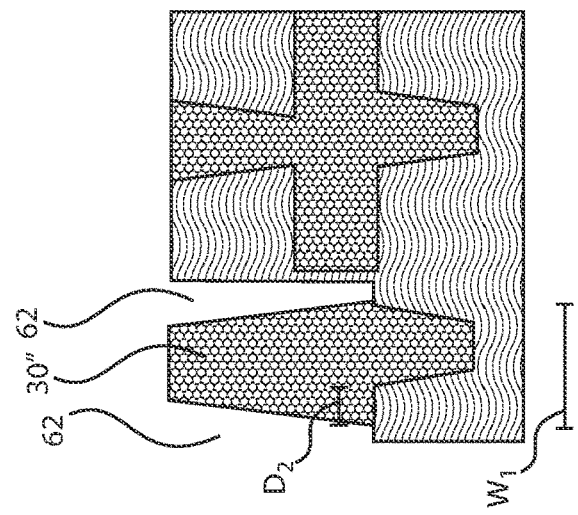
FIG. 14 is a cross-sectional view of a semiconductor structure of FIG. 13 where the conductive material is etched to form openings adjacent a cone-shaped conductive section, in accordance with an embodiment of the present invention.
Figure 15:
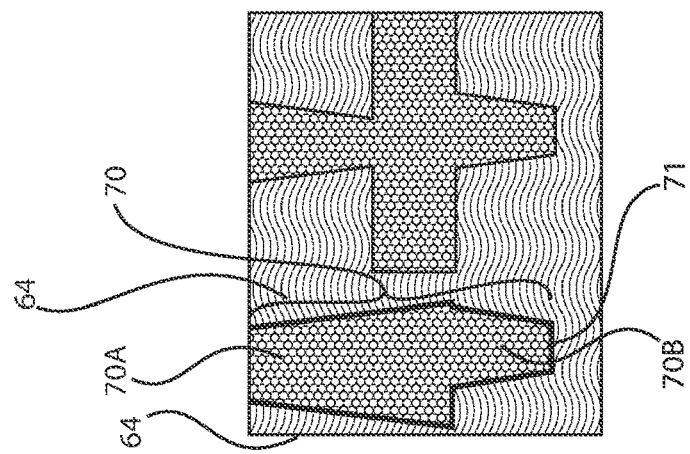
FIG. 15 is a cross-sectional view of the semiconductor structure of FIG. 14 where the openings are filled with a third dielectric to form a supervia, in accordance with an embodiment of the present invention.

FIGS. 14-15 described below show a case where the top section of the via is misaligned. The exemplary embodiments show that despite the misalignment, there is sufficient contact area owing to the characteristics of damascene and subtractive vias, as the former is wide at the top and the latter is wide at the bottom.

FIG. 14 is a cross-sectional view of a semiconductor structure of FIG. 13 where the conductive material is etched to form openings adjacent a cone-shaped conductive section, in accordance with an embodiment of the present invention.

In various example embodiments, the conductive material 30 is etched to form openings 62 adjacent a cone-shaped conductive section 30". The cone-shaped conductive section 30" will define the upper section or portion of the supervia.

FIG. 15 is a cross-sectional view of the semiconductor structure of FIG. 14 where the openings are filled with a third dielectric to form a supervia, in accordance with an embodiment of the present invention.

In various example embodiments, the openings 62 are filled with a third dielectric 64 to form a supervia 70. The supervia 70 has a substantially irregular shape. The supervia 70 thus has a top section 70A (or upper section) and a bottom section 70B (or lower section). The top section 70A is substantially or generally cone-shaped and the bottom section 70B is substantially or generally cone-shaped. However, the top section 70A is larger than the bottom section 70B. The maximum width of the top section 70A is not equal to the maximum width of the bottom section 70B. The maximum width of the top section 70A is designated as "$W_1$" (FIG. 14). The maximum width $W_1$ of the top section 70A of the supervia 70 extends a distance $D_2$ (FIG. 14) beyond the maximum width of the bottom section 70B.

The distal end 71 of the bottom section 70B is flat, not sharp or pointy. Stated differently, the distal end 71 is not obtuse (non-obtuse) or acute or angled or slanted or inclined. Instead, the distal end 71 defines a relatively large bottom critical dimension (CD).

This embodiment is applicable in cases where dense super-vias are not necessary. The exemplary embodiments can pattern the super-via mask to be larger than the desired size, thus allowing a few extra nm overlay margin. As a result, the top section 70A of the supervia 70 is greater than or occupies more space than the bottom section 70B of the supervia 70.

Therefore, the exemplary embodiments disclose a damascene lower portion of the via that is formed using standard damascene processing techniques. Then higher metal levels, including both lines and vias, are formed above with substrative etching techniques. A block mask 26 is used to remove dielectric and metal material in the supervia region. This is followed by metal deposition and etching, which forms the upper segment of the supervia 70. The exemplary embodiments thus enable a via that skips a metal level ("skip-via", or "super-via") and connects two non-adjacent metal levels. This further enables a low-resistance connection that wouldn't otherwise exist, and also avoids minimum-area constraints that restrict density scaling.

In summary, the exemplary embodiments of the present invention disclose a partial subtractive supervia enabling hyper-scaling. Super-vias are an important hyper-scaling element to enable shrinking of standard cells to realize density benefits. However, damascene patterning and/or substrative etching of high aspect ratio super-vias is quite challenging. In view thereof, the exemplary embodiments introduce a two-step supervia where the first portion or section or segment of the via is formed along with V0 in a damascene manner. The second portion or section or segment of the via is formed in M1/V1 by using a subtractive integration scheme. The unique integration scheme allows for better control over the via bottom critical dimension (CD). The method forms the supervia structure for back end of the line (BEOL) integration by enabling partial via formation by damascene approach, an M1 metal level that can be fabricated using either damascene or subtractive techniques, blocking of the already formed M1, V1 structure, patterning the supervia mask after V1 via mask to form rest of the via subtractively, and back filling with ultra-low-k (ULK) dielectric.

Stated differently, a method and a structure is presented for a vertical interconnect connection between non-adjacent interconnect wiring such that the lower portion of the supervia has a damascene profile while the upper portion of the supervia has a subtractive profile.

The advantages of the exemplary embodiments include at least eliminating the need for a longer reactive ion etch (RIE) process to create the super-via which would result in vias with much smaller contact area. Subtractive etches are known to result in an inverse taper, which is beneficial for this application as lower resistances can be achieved. Moreover, no extra processing steps are added. However, it is necessary for the supervia to be patterned at V0 and M1 levels. In summary, a partially subtractive supervia is presented that doesn't need extra processing steps and overcomes the issue of extremely thin bottom CD which needs extremely steep or obtuse slopes through RIE.

Regarding FIGS. 1-15, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

It is to be understood that the present invention will be described in terms of a given illustrative architecture.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of methods and devices for a vertical interconnect connection between non-adjacent interconnect wiring such that the lower portion of the supervia has a damascene profile while the upper portion has a subtractive profile (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device comprising:
   an upper section of a supervia, formed via subtractive etching, that defines a generally cone-shaped configuration; and
   a lower section of the supervia, formed via damascene processing, that defines a generally cone-shaped configuration,
   wherein the supervia connects non-adjacent interconnect wiring.

2. The semiconductor device of claim 1, wherein a distal end of the lower section of the supervia is non-obtuse.

3. The semiconductor device of claim 1, wherein a distal end of the lower section of the supervia is generally flat.

4. The semiconductor device of claim 1, wherein the lower section of the supervia is formed in a V0 level and the upper section of the supervia is formed in a M1/V1 metallization level.

5. The semiconductor device of claim 1, wherein a maximum width of the lower section of the supervia is equal to a maximum width of the upper section of the supervia.

6. The semiconductor device of claim 1, wherein a maximum width of the upper section of the supervia is greater than a maximum width of the lower section of the supervia.

7. A semiconductor device comprising:
   an upper section of a supervia, formed via subtractive etching, that defines a generally cone-shaped configuration; and
   a lower section of the supervia formed, via damascene processing, that defines a generally cone-shaped configuration,
   wherein a maximum width of the upper section of the supervia is greater than a maximum width of the lower section of the supervia.

8. The semiconductor device of claim 7, wherein the supervia connects non-adjacent interconnect wiring.

9. The semiconductor device of claim 7, wherein a distal end of the lower section of the supervia is non-obtuse.

10. The semiconductor device of claim 7, wherein a distal end of the lower section of the supervia is generally flat.

11. The semiconductor device of claim 7, wherein the lower section of the supervia is formed in a V0 level and the upper section of the supervia is formed in a M1/V1 metallization level.

12. A method comprising:
   forming an upper section of a supervia via subtractive etching to define a generally cone-shaped configuration of the upper section;
   forming a lower section of the supervia via damascene processing to define a generally cone-shaped configuration of the lower section; and
   enabling the supervia to connect non-adjacent interconnect wiring.

13. The method of claim 12, wherein a distal end of the lower section of the supervia is generally flat.

14. The method of claim 12, wherein a distal end of the lower section of the supervia is non-obtuse.

15. The method of claim 12, wherein the lower section of the supervia is formed in a V0 level and the upper section of the supervia is formed in a M1/V1 metallization level.

16. The method of claim 12, wherein a maximum width of the lower section of the supervia is equal to a maximum width of the upper section of the supervia.

17. The method of claim 12, wherein a maximum width of the upper section of the supervia is greater than a maximum width of the lower section of the supervia.

* * * * *